(12) United States Patent
Bonitz

(10) Patent No.: US 10,388,388 B2
(45) Date of Patent: Aug. 20, 2019

(54) RESPONDING TO POWER LOSS

(71) Applicant: MICRON TECHNOLOGY, INC., Boise, ID (US)

(72) Inventor: Rainer Bonitz, Bruckmuehl (DE)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/222,160

(22) Filed: Dec. 17, 2018

(65) Prior Publication Data

US 2019/0122739 A1    Apr. 25, 2019

Related U.S. Application Data

(62) Division of application No. 15/691,824, filed on Aug. 31, 2017, now Pat. No. 10,192,626.

(51) Int. Cl.
| | |
|---|---|
| *G11C 5/14* | (2006.01) |
| *G11C 16/34* | (2006.01) |
| *G11C 16/08* | (2006.01) |
| G11C 16/26 | (2006.01) |
| G11C 16/04 | (2006.01) |

(52) U.S. Cl.
CPC .......... *G11C 16/3418* (2013.01); *G11C 16/08* (2013.01); *G11C 16/04* (2013.01); *G11C 16/26* (2013.01)

(58) Field of Classification Search
CPC ..... G11C 16/3418; G11C 16/08; G11C 16/04; G11C 16/26
USPC ................................................. 365/226, 228
See application file for complete search history.

(56) References Cited

U.S. PATENT DOCUMENTS

| | | |
|---|---|---|
| 5,592,416 A | 1/1997 | Bonitz et al. |
| 5,914,895 A | 6/1999 | Jenne |
| 6,414,873 B1 | 7/2002 | Herdt |
| 6,965,524 B2 | 11/2005 | Choi |
| 7,016,227 B2 | 3/2006 | Inoue |
| 7,164,608 B2 | 1/2007 | Lee |
| 7,280,397 B2 | 10/2007 | Scheuerlein |
| 7,307,872 B2 | 12/2007 | Kang et al. |
| 7,395,452 B2 | 7/2008 | Nicholson et al. |
| 7,518,916 B2 | 4/2009 | Ashokkumar et al. |
| 7,663,917 B2 | 2/2010 | Cuppens et al. |
| 7,710,776 B2 | 5/2010 | Johal et al. |
| 7,760,540 B2 | 7/2010 | Still |

(Continued)

*Primary Examiner* — Viet Q Nguyen
(74) *Attorney, Agent, or Firm* — Dicke, Billig & Czaja, PLLC

(57) ABSTRACT

Apparatus, and methods of operating similar apparatus, might include an array of memory cells and a differential storage device configured to receive information indicative of a data value stored in a particular memory cell of the array of memory cells selected for a programming operation. The differential storage device might include a first non-volatile memory cell connected between a first isolation gate and a voltage node configured to receive a first voltage level, and a second non-volatile memory cell connected between a second isolation gate and the voltage node, and logic responsive to an indication of a loss of power to the apparatus and the information indicative of the data value stored in the particular memory cell to store data to the differential storage device, wherein a gate of the second non-volatile memory cell is connected to a gate of the first non-volatile memory cell.

9 Claims, 13 Drawing Sheets

(56) References Cited

U.S. PATENT DOCUMENTS

| | | |
|---|---|---|
| 8,018,768 B2 | 9/2011 | Shih et al. |
| 8,077,511 B2 | 12/2011 | Pesavento |
| 8,194,438 B2 | 6/2012 | Ahn et al. |
| 8,315,096 B2 | 11/2012 | Allan et al. |
| 8,516,172 B1 * | 8/2013 | Karamcheti ........ G06F 12/0246 |
| | | 710/62 |
| 8,817,536 B2 | 8/2014 | Scade et al. |
| 8,886,877 B1 * | 11/2014 | Avila .................... G06F 3/0679 |
| | | 711/103 |
| 8,929,163 B2 | 1/2015 | Taylor et al. |
| 8,947,122 B2 | 2/2015 | Prabhakar |
| 9,502,109 B2 | 11/2016 | Taniguchi et al. |
| 9,514,816 B1 | 12/2016 | Ashokkumar et al. |
| 9,697,897 B2 | 7/2017 | Sadd et al. |
| 9,933,955 B1 * | 4/2018 | Gosla .................... G06F 3/0656 |
| 2005/0162896 A1 | 7/2005 | Jung |
| 2006/0101301 A1 | 5/2006 | Nagao et al. |
| 2007/0002619 A1 | 1/2007 | Schoenauer et al. |
| 2011/0060861 A1 * | 3/2011 | Warren ............... G06F 12/0246 |
| | | 711/103 |
| 2012/0275209 A1 | 11/2012 | Evans, Jr. |
| 2012/0286851 A1 | 11/2012 | Yoneda |
| 2014/0229790 A1 * | 8/2014 | Goss .................. G06F 11/1048 |
| | | 714/755 |
| 2014/0281315 A1 * | 9/2014 | Danilak .............. G06F 11/1456 |
| | | 711/162 |
| 2015/0016188 A1 | 1/2015 | Tailliet et al. |
| 2015/0162063 A1 | 6/2015 | Mueller |
| 2016/0216901 A1 | 7/2016 | Takeshita |

\* cited by examiner

RESPONDING TO POWER LOSS

RELATED APPLICATION

This Application is a divisional of U.S. patent application Ser. No. 15/691,824, titled "RESPONDING TO POWER LOSS," filed Aug. 31, 2017, (allowed) which is commonly assigned and incorporated herein by reference.

TECHNICAL FIELD

The present disclosure relates generally to memory and, in particular, in one or more embodiments, the present disclosure relates to methods to respond to power loss in an apparatus.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

In programming memory, memory cells may generally be programmed as what are often termed single-level cells (SLC) or multiple-level cells (MLC). SLC may use a single memory cell to represent one digit (e.g., bit) of data. For example, in SLC, a Vt of 2.5V might indicate a programmed memory cell (e.g., representing a logical 0) while a Vt of −0.5V might indicate an erased cell (e.g., representing a logical 1). As an example, the erased state in SLC might be represented by any threshold voltage less than or equal to 0V, while the programmed data state might be represented by any threshold voltage greater than 0V.

MLC uses more than two Vt ranges, where each Vt range indicates a different data state. As is generally known, a margin (e.g., a certain number of volts), such as a dead space, may separate adjacent Vt ranges, e.g., to facilitate differentiating between data states. Multiple-level cells can take advantage of the analog nature of traditional non-volatile memory cells by assigning a bit pattern to a specific Vt range. While MLC typically uses a memory cell to represent one data state of a binary number of data states (e.g., 4, 8, 16, . . . ), a memory cell operated as MLC may be used to represent a non-binary number of data states. For example, where the MLC uses three Vt ranges, two memory cells might be used to collectively represent one of eight data states.

In programming MLC memory, data values are often programmed using more than one pass, e.g., programming one or more digits in each pass. For example, in four-level MLC (typically referred to simply as MLC), a first digit, e.g., a least significant bit (LSB), often referred to as lower page (LP) data, may be programmed to the memory cells in a first pass, thus resulting in two (e.g., first and second) threshold voltage ranges. Subsequently, a second digit, e.g., a most significant bit (MSB), often referred to as upper page (UP) data may be programmed to the memory cells in a second pass, typically moving some portion of those memory cells in the first threshold voltage range into a third threshold voltage range, and moving some portion of those memory cells in the second threshold voltage range into a fourth threshold voltage range. Similarly, eight-level MLC (typically referred to as TLC) may represent a bit pattern of three bits, including a first digit, e.g., a least significant bit (LSB) or lower page (LP) data; a second digit, e.g., upper page (UP) data; and a third digit, e.g., a most significant bit (MSB) or extra page (XP) data. In operating TLC, the LP data and the UP data may be programmed to the memory cells in a first pass, resulting in four threshold voltage ranges, followed by the XP data (and, possibly, reprogramming of the UP data) in a second pass, resulting in eight threshold voltage ranges.

In each pass, programming typically utilizes an iterative process of applying a programming pulse to a memory cell and verifying if that memory cell has reached its desired data state in response to that programming pulse, and repeating that iterative process until that memory cell passes the verification. Once a memory cell passes the verification, it may be inhibited from further programming. The iterative process can be repeated with changing (e.g., increasing) voltage levels of the programming pulse until each memory cell selected for the programming operation has reached its respective desired data state, or some failure is declared, e.g., reaching a maximum number of allowed programming pulses during the programming operation.

During programming of a second or other subsequent pass, prior or lower page bit information is typically stored in a latch or other volatile storage device, such as a latch of a sensing device. In some cases, this information may be read from the memory cells prior to beginning the subsequent pass. If a memory device is powered down abruptly during the subsequent programming pass, or otherwise loses power in an uncontrolled manner, e.g., asynchronous power loss, this lower page data may be lost.

DETAILED DESCRIPTION

Figure 1A:
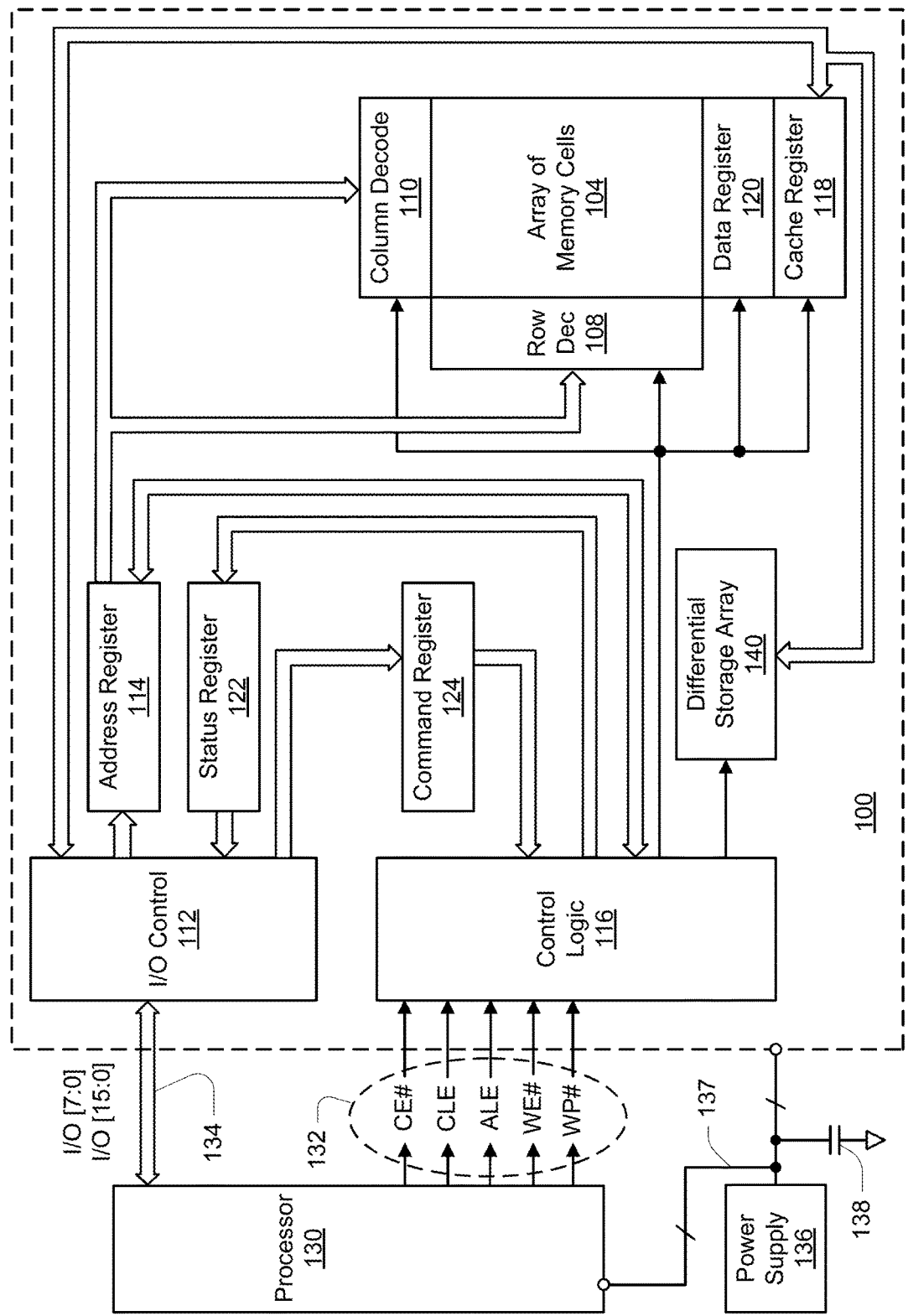
FIG. 1A is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions. The term conductive as used herein, as well as its various related forms, e.g., conduct, conductively, conducting, conduction, conductivity, etc., refers to electrically conductive unless otherwise apparent from the context. Similarly, the term connecting as used herein, as well as its various related forms, e.g., connect, connected, connection, etc., refers to electrically connecting unless otherwise apparent from the context. Although particular values of voltages may be given in the description to aid understanding, such voltages are dependent upon the specific design, materials and technology used in fabrication in manners understood by those in the field of integrated circuit fabrication, design and operation.

Automobiles and other vehicles are becoming increasingly technologically advanced. Infotainment, instrument cluster, engine control and driver assistance areas, for example, typically utilize larger and larger amounts of memory as these systems become increasingly complex. Some of these memory uses are system critical to the safety and/or reliability of the vehicle. In addition, these systems may need, or benefit from, updating from time to time. Loss of data may leave the vehicle disabled or otherwise undriveable. As such, when memory is being updated, it may be vitally important to preserve the intended data should the memory experience a power loss during programming.

Various embodiments may facilitate preservation of prior (e.g., lower) page data if a power loss event is indicated during programming of a subsequent (e.g., upper) page of data. Such embodiments utilize a differential storage device having associated logic to initiate (e.g., automatically initiate) backup of the prior page data in response to an indication that a power loss has occurred. Due to its differential nature, determining the data state of the differential storage device may be facilitated with only minor changes in threshold voltage. As such, a verify operation may be unnecessary following programming. Furthermore, programming times might be shortened compared to programming of a typical array of memory cells. It may thus be possible to obtain sufficient programming of the differential storage devices without the need for an added hold-up capacitance or other energy storage device as is typically used to recover from a power loss event.

FIG. 1A is a simplified block diagram of a first apparatus, in the form of a memory (e.g., memory device) 100, in communication with a second apparatus, in the form of a processor 130, and a third apparatus, in the form of a power supply 136, as part of a fourth apparatus, in the form of an electronic system, according to an embodiment. For some embodiments, the power supply 136 may be external to an electronic system containing the processor 130 and the memory device 100. Some examples of electronic systems include personal computers, personal digital assistants (PDAs), digital cameras, digital media players, digital recorders, games, appliances, vehicles, wireless devices, mobile telephones, removable memory modules and the like. The processor 130, e.g., a controller external to the memory device 100, may represent a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1A) of at least a portion of array of memory cells 104 are arranged in strings of series-connected memory cells.

A row decode circuitry 108 and a column decode circuitry 110 are provided to decode address signals. Address signals are received and decoded to access the array of memory cells 104, e.g., for programming operations, read operations, erase operations, etc. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller, such as an internal controller (e.g., control logic 116), controls access to the array of memory cells 104 in response to the commands and generates status information for the external processor 130, i.e., control logic 116 may be configured to perform operations (e.g., backup and restore operations) in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118 and data register 120. Cache register 118 latches data, either incoming or outgoing, as directed by control logic 116 to temporarily store data while the array of memory cells 104 is busy writing or reading, respectively, other data. During a programming operation (e.g., often referred to as a write operation), data is passed from the cache register 118 to the data register 120 for transfer to the array of memory cells 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Control logic 116 is further in communication with a differential storage array 140 in accordance with an embodiment. The differential storage array 140 may further be in communication with the cache register 118, for example, for receiving an indication of a data value (e.g., a value of a digit of data) stored in a memory cell of the array of memory cells 104, or for providing an indication of a data value to store to a memory cell of the array of memory cells 104. The differential storage array 140 may contain one or more differential storage devices (not shown in FIG. 1A) in accordance with an embodiment. For example, the differential storage array 140 may include a respective differential storage device for each memory cell of a logical page of memory cells selected for a programming operation (e.g., a single programming operation) on the array of memory cells 104, times a number of digits of data to previously stored to each of the memory cells of the logical page of memory cells. For four-level MLC operation, this may include one differential storage device to facilitate storage of the lower page data for each respective memory cell of the logical page of memory cells if power is lost during programming of the upper page data. For eight-level MLC operation, this may include two differential storage devices to facilitate storage of the lower and upper page data for each respective memory cell of the logical page of memory cells if power is lost during programming of the extra page data.

Memory device 100 receives control signals at control logic 116 from processor 130 over a control link 132. The control signals may include at least a chip enable CE#, a command latch enable CLE, an address latch enable ALE, a write enable WE#, and a write protect WP#. Additional control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming the array of memory cells 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

Memory device 100 and/or processor 130 may receive power from the power supply 136. Power supply 136 may represent any combination of circuitry for providing power to memory device 100 and/or processor 130. For example, power supply 136 might include a stand-alone power supply (e.g., a battery), a line-connected power supply (e.g., a switched-mode power supply common in desktop computers and servers or an AC adapter common for portable electronic devices), or a combination of the two.

Power is typically received from the power supply 136 using two or more voltage supply nodes 137, such as a supply voltage node (e.g., Vcc) and a reference voltage node (e.g., Vss or ground). It is not uncommon for a power supply 136 to provide more than two voltage supply nodes 137. For example, a common standard for switched-mode power supplies, ATX (Advanced Technology eXtended) 2.x, provides, using a 28-pin connection, four voltage supply nodes (or pins) at +3.3V, five voltage supply nodes at +5V, four voltage supply nodes at +12V, one voltage supply node at 12V, and ten voltage supply nodes at a reference voltage (e.g., 0V). The ATX 2.x standard further provides a power-on node for activating the foregoing voltage supply nodes when it is pulled to ground by an external circuit, a standby voltage supply node driven to +5V regardless of whether the other voltage supply nodes are being driven to their respective voltage levels (which can be used to power the external circuit responsible for pulling the power-on node to ground), and a power-good node for indicating when the other voltage supply nodes are stabilized at their respective voltages. The remaining pin of the ATX 2.x 28-pin standard may be undefined. Memory device 100 and processor 130 may utilize differing combinations of voltage supply nodes 137 from power supply 136 depending upon their respective power needs. For simplicity, distribution of power from the voltage supply nodes 137 to components within the memory device 100 is not depicted.

The voltage supply nodes 137, or other components of the electronic system, may have an inherent or added energy storage device, such as capacitance 138, e.g., a hold-up capacitance, that can provide power to the memory device 100, and optionally to the processor 130, for some finite amount of time in the case of failure or removal of the power supply 136. Sizing of the capacitance 138 can be readily determined based on the power requirements of at least the memory device 100 for the operations described herein. While the energy storage device is depicted as the capacitance 138 in examples herein, the capacitance 138 could alternatively represent a battery. Furthermore, while the capacitance 138 is depicted to be external to the memory device 100, it could alternatively be an internal component of the memory device 100.

It will be appreciated by those skilled in the art that additional circuitry and signals can be provided, and that the memory device 100 of FIG. 1A has been simplified. It should be recognized that the functionality of the various block components described with reference to FIG. 1A may not necessarily be segregated to distinct components or component portions of an integrated circuit device. For example, a single component or component portion of an integrated circuit device could be adapted to perform the functionality of more than one block component of FIG. 1A. Alternatively, one or more components or component portions of an integrated circuit device could be combined to perform the functionality of a single block component of FIG. 1A.

Additionally, while specific I/O pins are described in accordance with popular conventions for receipt and output of the various signals, it is noted that other combinations or numbers of I/O pins may be used in the various embodiments.

Figure 1B:
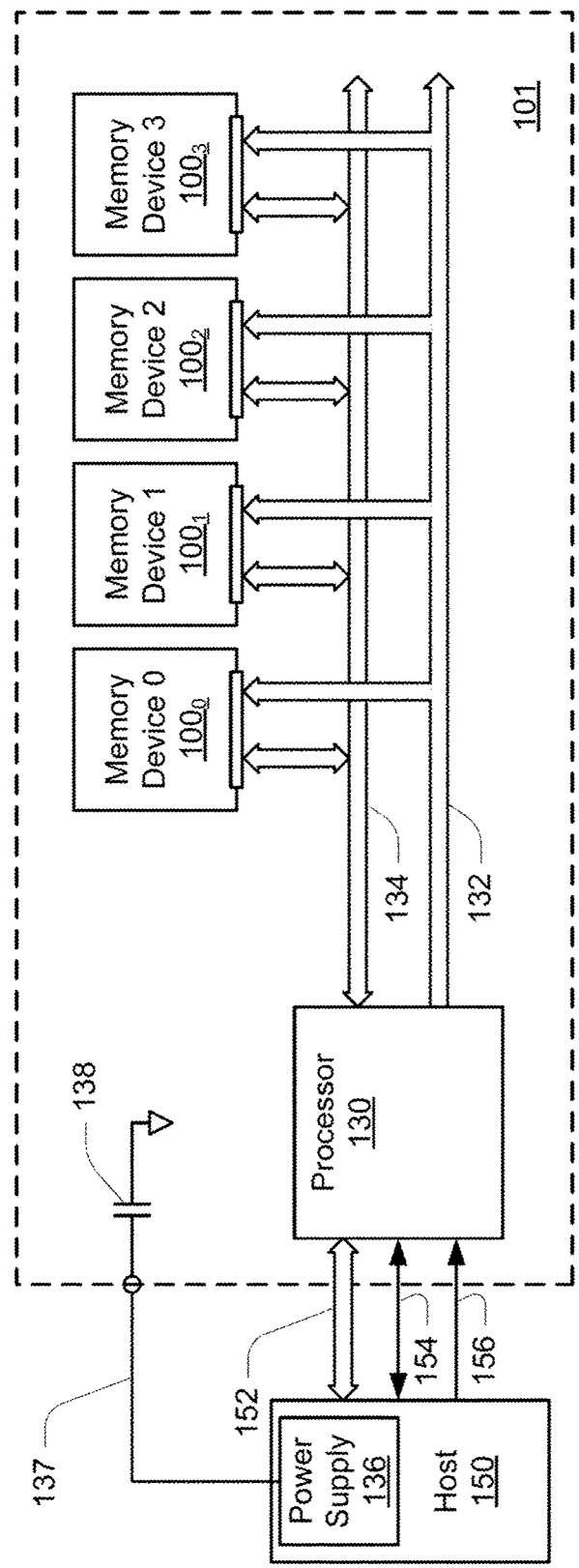
FIG. 1B is a simplified block diagram of an apparatus in the form of a memory module in communication with a host as part of an electronic system, according to another embodiment

A given processor 130 may be in communication with one or more memory devices 100, e.g., dies. FIG. 1B is a simplified block diagram of an apparatus in the form of a memory module 101 in communication with a host 150 as part of an electronic system, according to another embodiment. Memory devices 100, processor 130, control link 132, I/O bus 134, power supply 136, voltage supply nodes 137 and capacitance 138 may be as described with reference to FIG. 1A. For simplicity, distribution of power from the voltage supply nodes 137 to the memory devices 100 and processor 130 within the memory module 101 is not depicted. Although memory module (e.g., package) 101 of FIG. 1B is depicted with four memory devices 100 (e.g., dies), memory module 101 could have some other number of one or more memory devices 100.

Because processor 130 (e.g., a memory controller) is between the host 150 and the memory devices 100, communication between the host 150 and the processor 130 may involve different communication links than those used between the processor 130 and the memory devices 100. For example, the memory module 101 may be an Embedded MultiMediaCard (eMMC) of a solid state drive (SSD). In accordance with existing standards, communication with an eMMC may include a data link 152 for transfer of data (e.g., an 8-bit link), a command link 154 for transfer of commands and device initialization, and a clock link 156 providing a clock signal for synchronizing the transfers on the data link 152 and command link 154. The processor 130 may handle many activities autonomously, such as power-loss detection, error correction, management of defective blocks, wear leveling and address translation.

Figure 2A:
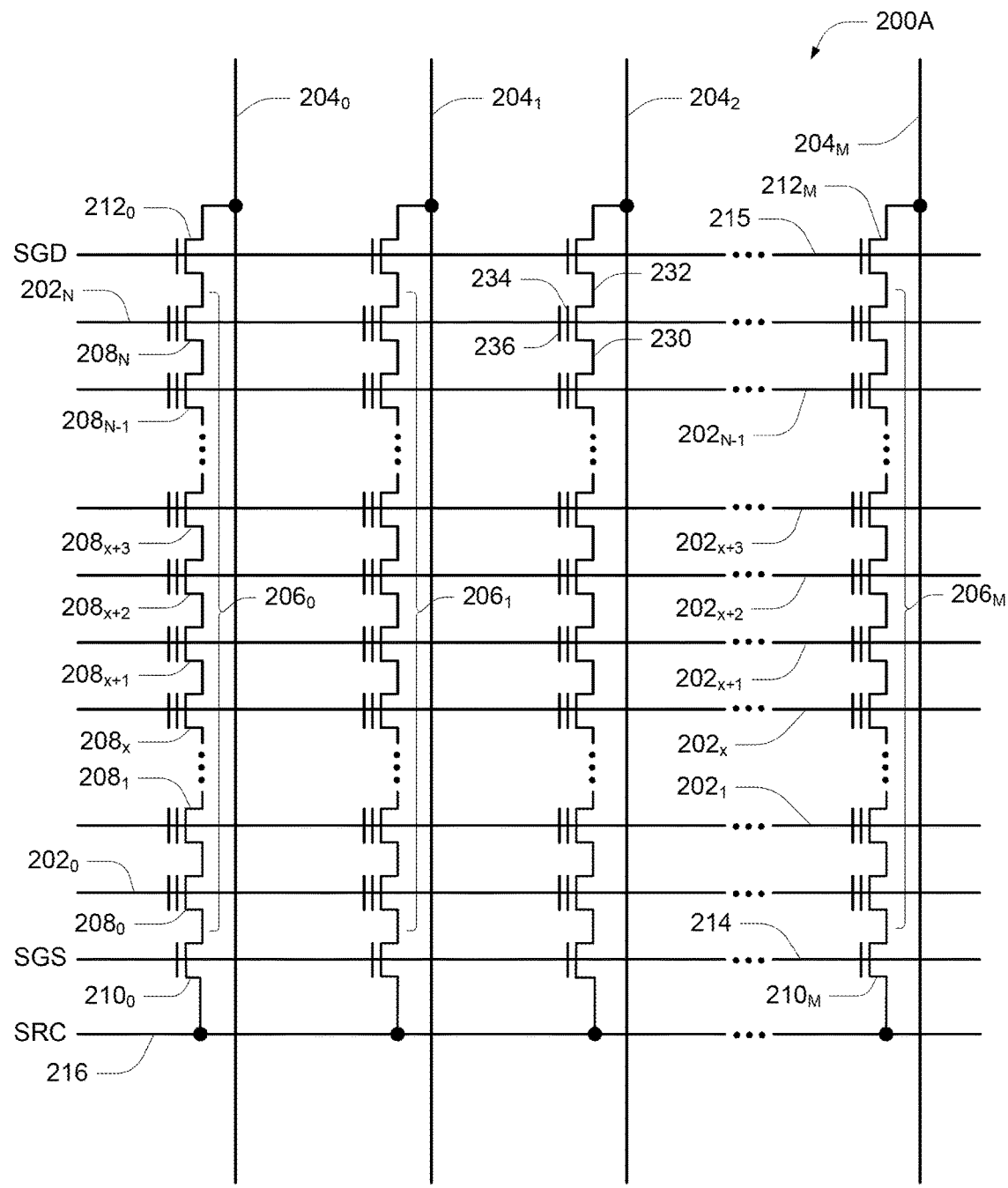
FIGS. 2A-2B are schematics of portions of an array of memory cells as could be used in a memory of the type described with reference to FIG. 1A.

FIG. 2A is a schematic of a portion of an array of memory cells 200A as could be used in a memory of the type described with reference to FIG. 1A, e.g., as a portion of array of memory cells 104. Memory array 200A includes access lines, such as word lines $202_0$ to $202_N$, and a data line, such as bit line 204. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells, such as one of NAND strings $206_0$ to $206_M$. Each NAND string 206 might be connected (e.g., selectively connected) to a common source 216 and might include memory cells $208_0$ to $208_N$. The memory cells 208 may represent non-volatile memory cells for storage of data. The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line, and select gates $212_0$ to $212_M$ might be commonly connected to a select line 215, such as a drain select line. Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the common bit line 204. A control gate of each select gate 212 might be connected to select line 215.

The memory array in FIG. 2A might be a three-dimensional memory array, e.g., where NAND strings 206 may extend substantially perpendicular to a plane containing the common source 216 and to a plane containing a plurality of bit lines 204 that may be substantially parallel to the plane containing the common source 216.

Typical construction of memory cells 208 includes a data-storage structure 234 (e.g., a floating gate, charge trap, etc.) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source 230 and a defined drain 232. Memory cells 208 have their control gates 236 connected to (and in some cases form) a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). For example, an elevated voltage (e.g., 25V) might be applied to the bit lines 204 and the source 216 while a reference voltage (e.g., Vss or ground) is applied to the word lines 202 to remove charge from the memory cells 208. Unless expressly distinguished, a reference to a page of memory cells herein refers to the memory cells of a logical page of memory cells.

Figure 2B:
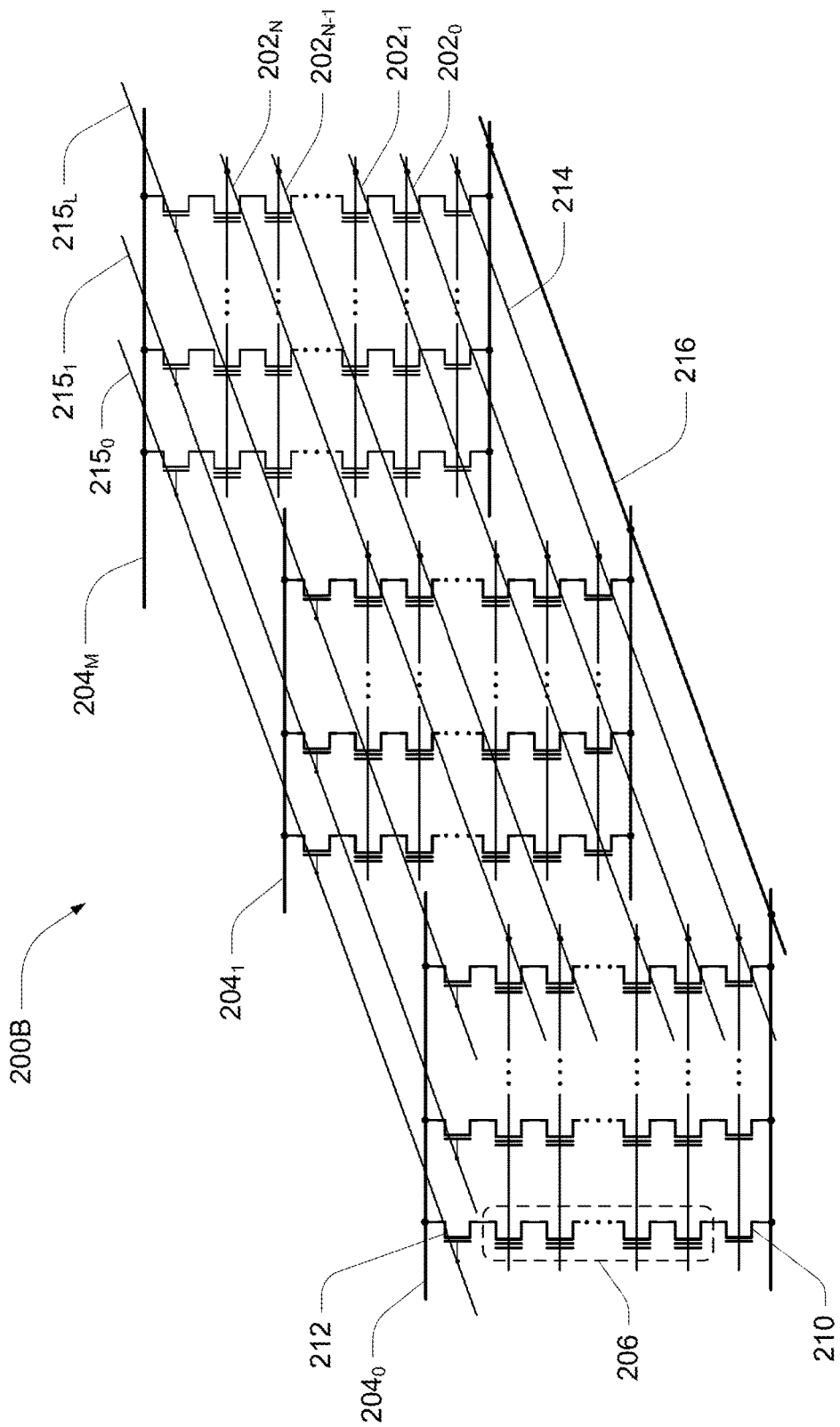

FIG. 2B is another schematic of a portion of an array of memory cells 200B as could be used in a memory of the type described with reference to FIG. 1A, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_L$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Figure 3A:
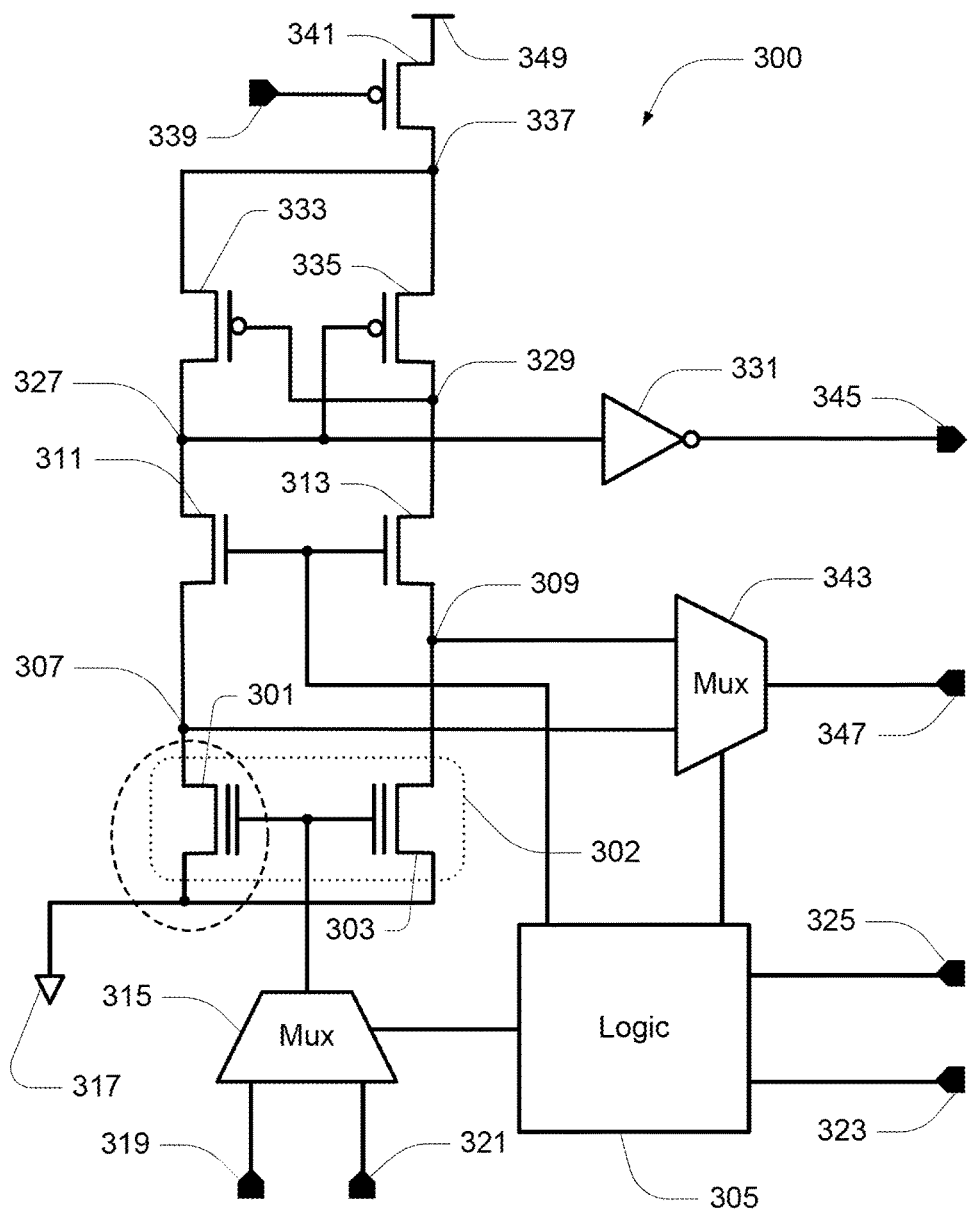
FIG. 3A is a schematic of a differential storage device 300 in accordance with an embodiment.

FIG. 3A is a schematic of a differential storage device 300 in accordance with an embodiment. The differential storage may include a first non-volatile memory cell 301 and a second non-volatile memory cell 303 connected in parallel. Each of the non-volatile memory cells 301/303 may have a structure of the type described with reference to the memory cells 208 of FIG. 2A, e.g., each non-volatile memory cell 301/303 may include a field-effect transistor (e.g., an n-type field effect transistor or nFET) having a data-storage structure that can determine a data state of that memory cell through changes in threshold voltage. The gate (e.g., control gate) of the non-volatile memory cell 301 may be connected to the gate (e.g., control gate) of the non-volatile memory cell 303. The non-volatile memory cell 301 may be connected in series between a node 307 and a voltage node 317, such as a reference voltage node configured to receive a reference voltage such as Vss, ground or 0V, for example. The non-volatile memory cell 303 may be connected in series between a node 309 and the voltage node 317. For example, the non-volatile memory cell 301 may have a first source/drain connected to the voltage node 317 and a second source/drain connected to the node 307, while the non-volatile memory cell 303 may have a first source/drain connected to the voltage node 317 and a second source/drain connected to the node 309. The differential storage device 300 may facilitate storing a digit (e.g., bit) of data determined in response to a difference in current flow through each of the non-volatile memory cells 301/303 of the pair of gate-connected non-volatile memory cells.

The differential storage device 300 may further include an isolation gate (e.g., nFET) 311 having a first source/drain connected to the node 307 and a second source/drain connected to the node 327, and an isolation gate (e.g., nFET) 313 having a first source/drain connected to the node 309 and a second source/drain connected to the node 329. The gate (e.g., control gate) of the nFET 311 may be connected to the gate (e.g., control gate) of the nFET 313. The differential storage device 300 may further include a p-type field-effect transistor (pFET) 333 having a first source/drain connected to the node 327 and a second source/drain connected to the node 337, and a pFET 335 having a first source/drain connected to the node 329 and a second source/drain connected to the node 337. The gate (e.g., control gate) of the pFET 333 may be connected to the node 329 while the gate (e.g., control gate) of the pFET 335 may be connected to the node 327.

The differential storage device 300 may further include a pFET 341 having a first source/drain connected to the node 337 and a second source/drain connected to the voltage node 349. The voltage node 349 may be configured to receive a supply voltage, such as Vcc or other voltage greater than the voltage level of the voltage node 317. The supply voltage may be a voltage (e.g., one of the voltages) used to access the array of memory cells. The gate (e.g., control gate) of the pFET 341 may be connected to the control signal node 339.

The differential storage device 300 may further include an output buffer, such as inverter 331. The inverter 331 has an input connected to the node 327, and an output connected to the buffer output node 345. The differential storage device may further include a multiplexer 315 and a multiplexer 343. The multiplexer 315 may be connected to receive a plurality of voltage signals, such as voltage signals received from voltage signal nodes 319 and 321. The voltage signal node 319 may be configured to receive a first voltage, such as a read voltage, and the voltage signal node 321 may be configured to receive a second voltage, such as a program voltage. The output of the multiplexer 315 may be connected to the gates of the non-volatile memory cells 301 and 303. The multiplexer 343 may be configured to receive a voltage signal, such as a voltage signal from voltage signal node 347. The voltage signal node 347 may be configured to receive a voltage, e.g., a drain voltage configured to enable programming of one of the non-volatile memory cells 301 or 303 as described below.

The differential storage device 300 may further include logic 305 for access of the differential storage device 300. The logic 305 may be responsive to a plurality of control signals, such as control signals received from control signal nodes 323 and 325. Control signal node 323 may be configured to receive one or more control signals indicative of a data value (e.g., a digit of data) of a memory cell. The data value of the memory cell may represent one page (e.g., one digit) of data of an MLC memory cell. For example, during programming of an upper page of data to a memory cell configured to store two pages of data, the data value of the lower page of data may be stored (e.g., in a cache register or other temporary storage location). The control signal node 323 may be configured to receive a control signal indicative of the data value of the lower page of data, and may further be configured to receive a control signal that is a complement of the control signal indicative of the data value of the lower page of data. Control signal node 325 may be configured to receive one or more control signals indicative of whether a power fail is indicated. For example, the control signal node 325 may be configured to receive a control signal indicative of whether a power fail is indicated, and may further be configured to receive a control signal that is a complement of the control signal indicative of whether a power fail is indicated. The logic 305 may further be responsive to one or more other control signals.

The multiplexer 315 may be responsive to one or more control signals from the logic 305 to select one of its input voltage signals to apply to the gates of the non-volatile memory cells 301 and 303. The multiplexer 343 may be responsive to one or more control signals from the logic 305 to apply its received voltage to a select one of the nodes 307 and 309 for application to the second source/drain of the non-volatile memory cell 301 or the second source/drain of the non-volatile memory cell 303, respectively. The logic 305 may further be configured to provide a control signal to the gates of the nFETs 311 and 313 to selectively activate nFETS 311 and 313, such as during a read operation on the differential storage device 300, or deactivate nFETs 311 and 313, such as during a programming operation on one of the non-volatile memory cells 301 or 303.

In the differential storage device 300, it can be seen that if the non-volatile memory cell 301 is unprogrammed (e.g., having a threshold voltage at an initial value) and the non-volatile memory cell 303 is programmed (e.g., having a threshold voltage greater than the initial value), the unprogrammed non-volatile memory cell 301 may be activated in response to a voltage level applied to its gate while the programmed non-volatile memory cell 303 may remain deactivated in response to that same voltage level. By activating the nFETs 311 and 313, and activating the pFET 341, current may flow through the non-volatile memory cell 301 while the non-volatile memory cell 303 may inhibit such current flow. As a result, the node 327 will have a logic low level, thus activating the pFET 335. This will bring node 329 to a logic high level, thus deactivating the pFET 333 and maintaining the node 327 at the logic low level. The buffer output node 345 may have a logic high level as a result.

Conversely, if the non-volatile memory cell 301 is programmed and the non-volatile memory cell 303 is unprogrammed, activating the nFETs 311 and 313, and activating the pFET 341, may result in current flow through the non-volatile memory cell 303 while the non-volatile memory cell 301 may inhibit such current flow. As a result, the node 329 will have a logic low level, thus activating the pFET 33. This will bring node 327 to a logic high level, thus deactivating the pFET 333 and maintaining the node 327 at the logic high level. The buffer output node 345 may have a logic low level as a result.

To program the differential storage device 300, the nFETs 311 and 313 may be deactivated to isolate the non-volatile memory cells 301 and 303 from the pFETs 333 and 335. The voltage level of the voltage signal node 321 may be applied to the gates of both non-volatile memory cells 301 and 303, while the voltage level of the voltage signal node 347 may be applied to the second source/drain of the non-volatile memory cell 301 or 303 selected for programming. As one example, the voltage level of the voltage signal node 321 may be about 15V while the voltage level of the voltage signal node 347 may be about 5V. In this manner, the non-volatile memory cells 301 and 303 would both be activated, the non-volatile memory cell 301 or 303 receiving the voltage level of the voltage signal node 321 at its second source/drain (e.g., at node 307 or 309, respectively) would be conducting current to the voltage node 317 and charge carriers (e.g., electrons) could tunnel or otherwise be injected into the data-storage node of that non-volatile memory cell. The remaining non-volatile memory cell 301 or 303 would have its second source/drain connected to the voltage node 317, and may not experience an increase of electrons in its data-storage node, such that it would remain in its initial (e.g., erased) state. However, even if this non-volatile memory cell experienced some tunneling effect, it would be expected to be less than that of the non-volatile memory cell selected for programming. Due to the differential nature of the differential storage device, this difference in threshold voltage could still be exploited to distinguish the stored data value. A non-volatile memory cell 301 or 303 that is not selected for programming, and that experiences such incidental accumulation of charge in its data-storage structure, will still be deemed an unprogrammed memory cell.

The non-volatile memory cells 301 and 303 might optionally be formed in an isolated well structure 302, e.g., a semiconductor structure isolated from bodies of remaining transistors of the differential storage device 300. In this manner, the bodies of the non-volatile memory cells 301 and 303 might be biased at an erase voltage, e.g., 20V, while the control gates of the non-volatile memory cells 301 and 303 are biased at a lower voltage expected to remove charge from data-storage structures of the non-volatile memory cells 301 and 303, e.g., Vss. This could facilitate erasure of the non-volatile memory cells 301 and 303 while mitigating detrimental effect on remaining components of the differential storage device 300.

Figure 3B:
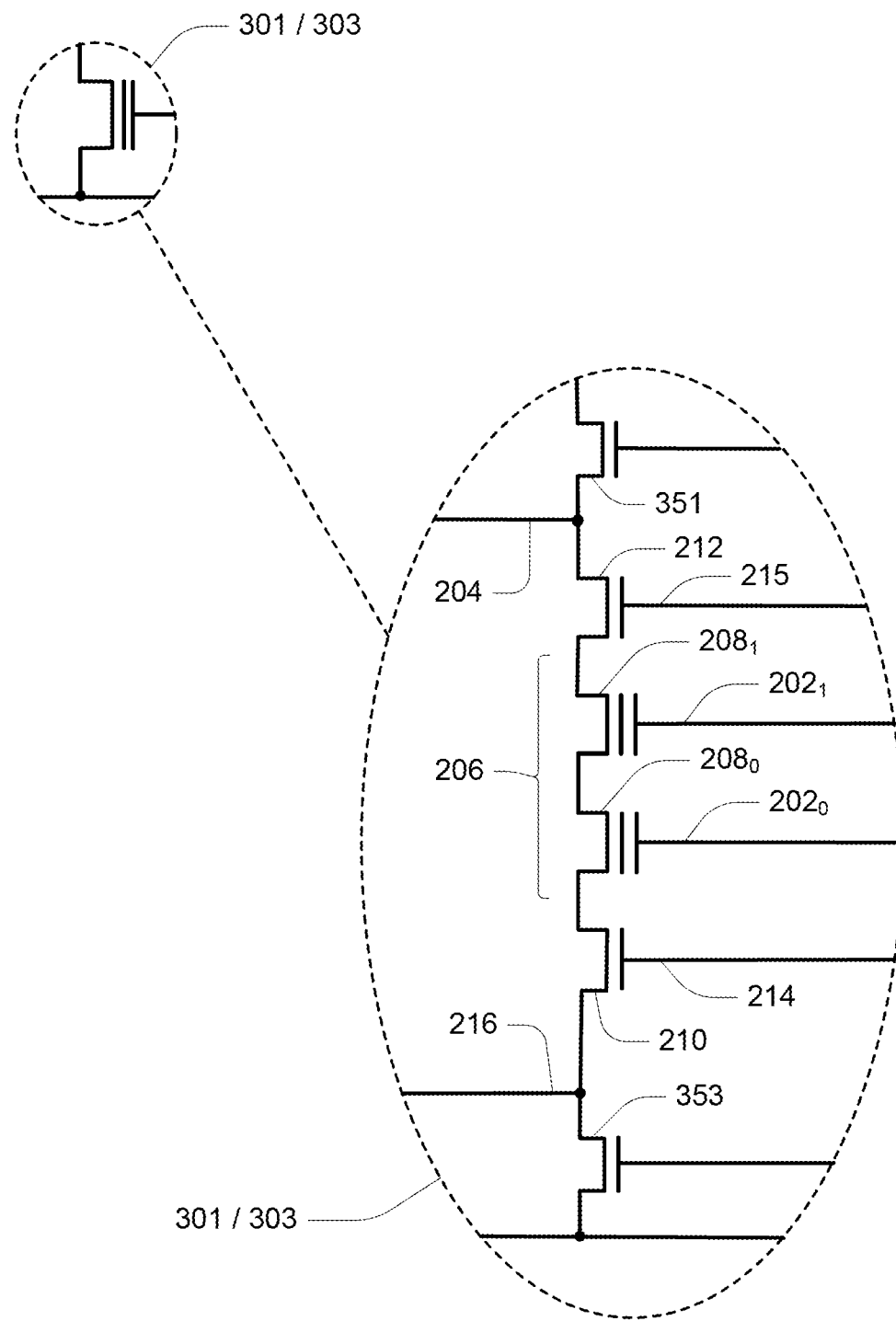
FIG. 3B is a schematic of an alternate structure that could be used as a non-volatile memory cell a differential storage device in accordance with an embodiment.

Although the non-volatile memory cells 301 and 303 of the differential storage device 300 are depicted as distinct devices, embodiments may utilize structures similar to (e.g., the same as) the NAND strings shown in FIG. 2A. FIG. 3B is a schematic of an alternate structure that could be used as a non-volatile memory cell 301 or 303 of the differential storage device 300 in accordance with an embodiment. As shown in FIG. 3B, the non-volatile memory cell 301 or 303 may be represented as a NAND string 206. In addition, although depicted in FIG. 3B as a NAND string 206 having two memory cells 208 in series, the NAND string 206 could be modified to include only one memory cell 208 between the select gates 210 and 212, or it could include additional memory cells 208 in series. For embodiments using NAND strings 206 having more than one memory cell 208, the output of the multiplexer 315 might be applied to only one of the word lines 202, or it might be applied to more than one, and possibly all, of the word lines 202 such that multiple memory cells 208 in series may act as a single non-volatile memory cell 301 or 303.

By incorporating isolation gates (e.g., nFETs) 351 and 353, the NAND string 206 could be isolated from remaining circuitry of the differential storage device 300. As a result, the non-volatile memory cell 301 or 303 could be erased using the same mechanisms discussed with respect to FIG. 2A. The logic 305 could be modified accordingly to activate the nFETs 351 and 353 whenever access to the non-volatile memory cells 301 or 303 is desired.

Figure 4:
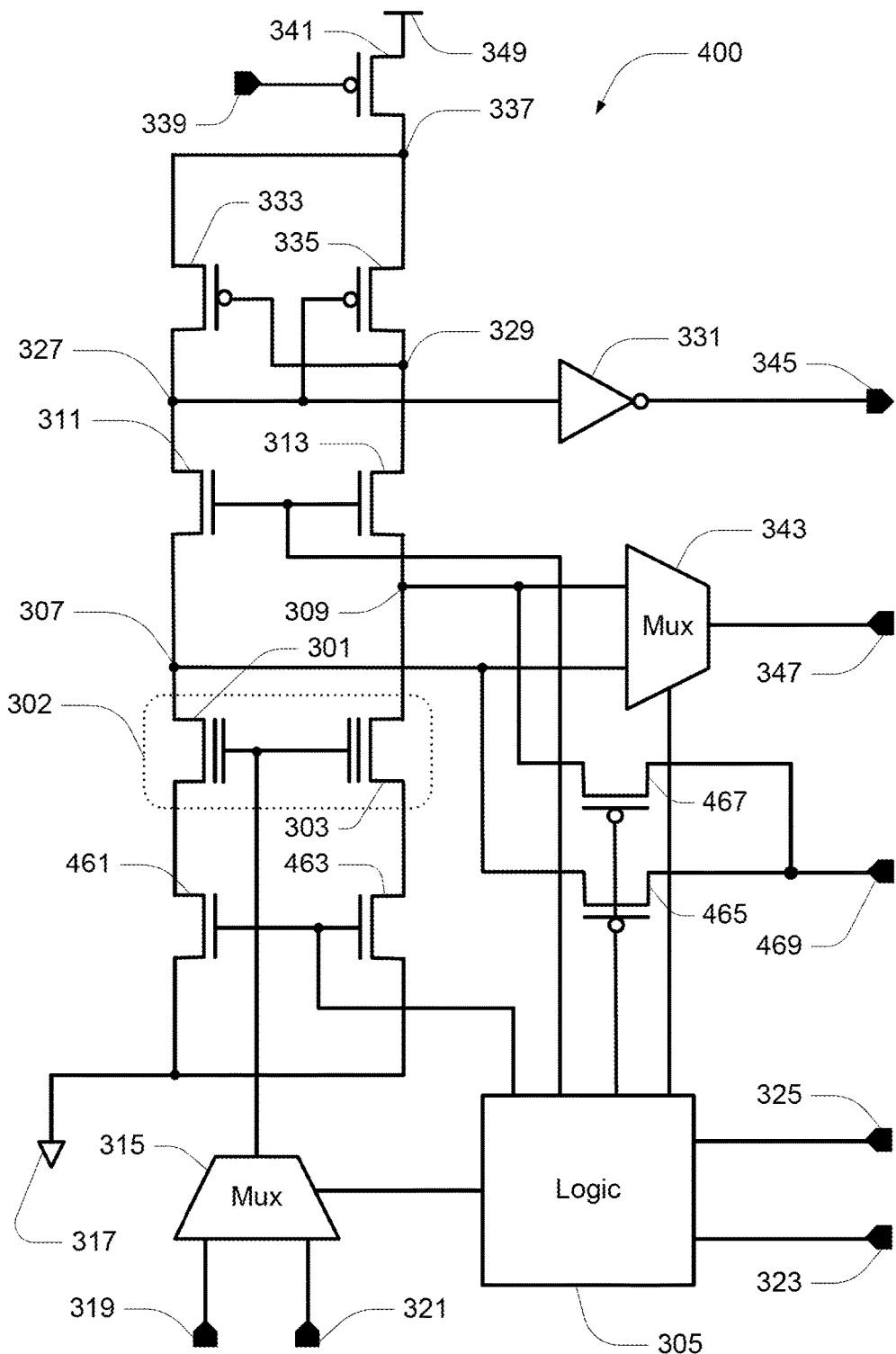
FIG. 4 is a schematic of a differential storage device 400 in accordance with another embodiment.

FIG. 4 is a schematic of a differential storage device 400 in accordance with another embodiment. The differential storage device 400 may differ from the differential storage device 300 in the addition of isolation gates (e.g., nFETs) 461 and 463, and pFETs 465 and 467. The nFET 461 is connected in series between the non-volatile memory cell 301 and the voltage node 317, while the nFET 463 is connected in series between the non-volatile memory cell 303 and the voltage node 317. The nFETs 461 and 463 have their gates (e.g., control gates) connected together, and are responsive to control signals from the logic 305. The pFET 465 has a first source/drain connected to the node 307 and a second source/drain connected to the voltage signal node 469. The pFET 467 has a first source/drain connected to the node 309 and a second source/drain connected to the voltage signal node 469. The pFETs 465 and 467 have their gates (e.g., control gates) connected together, and are responsive to control signals from the logic 305. The voltage signal node 469 may be configured to receive an erase voltage. For example, the erase voltage may be some voltage level that is higher than the voltage level of the voltage signal node 319 that when both are applied to nodes 307/309 and the gates of the non-volatile memory cells 301/303, respectively, and the nFETs 461 and 463 are deactivated (e.g., to float the remaining source/drain of each non-volatile memory cell 301/303), the voltage drop from the channel of the non-volatile memory cells 301/303 to the gates of the non-volatile memory cells 301/303 is sufficient to remove charge from the data-storage structure of the non-volatile memory cells 301/303.

Alternatively, the erase voltage could be applied (e.g., selectively applied) to the voltage signal node 347 such that the multiplexer 343 could be used to selectively apply the erase voltage to a single node 307 or 309 to erase only the non-volatile memory cell 303 or 303 that had previously been programmed. This might be useful in mitigating any issues of over erasing a memory cell. Note that during an erase operation on the differential storage device 400, the nFETs 311 and 313 may also be deactivated. Additionally, the multiplexer 315 might be configured to have a third input connected to the voltage node 317, such that a reference voltage (e.g., Vss, ground or 0V) could be applied to the gates of the non-volatile memory cells 301 and 303, which might facilitate a reduction in the voltage level of the erase voltage relative to using the voltage level of the voltage signal node 319.

Figure 5:
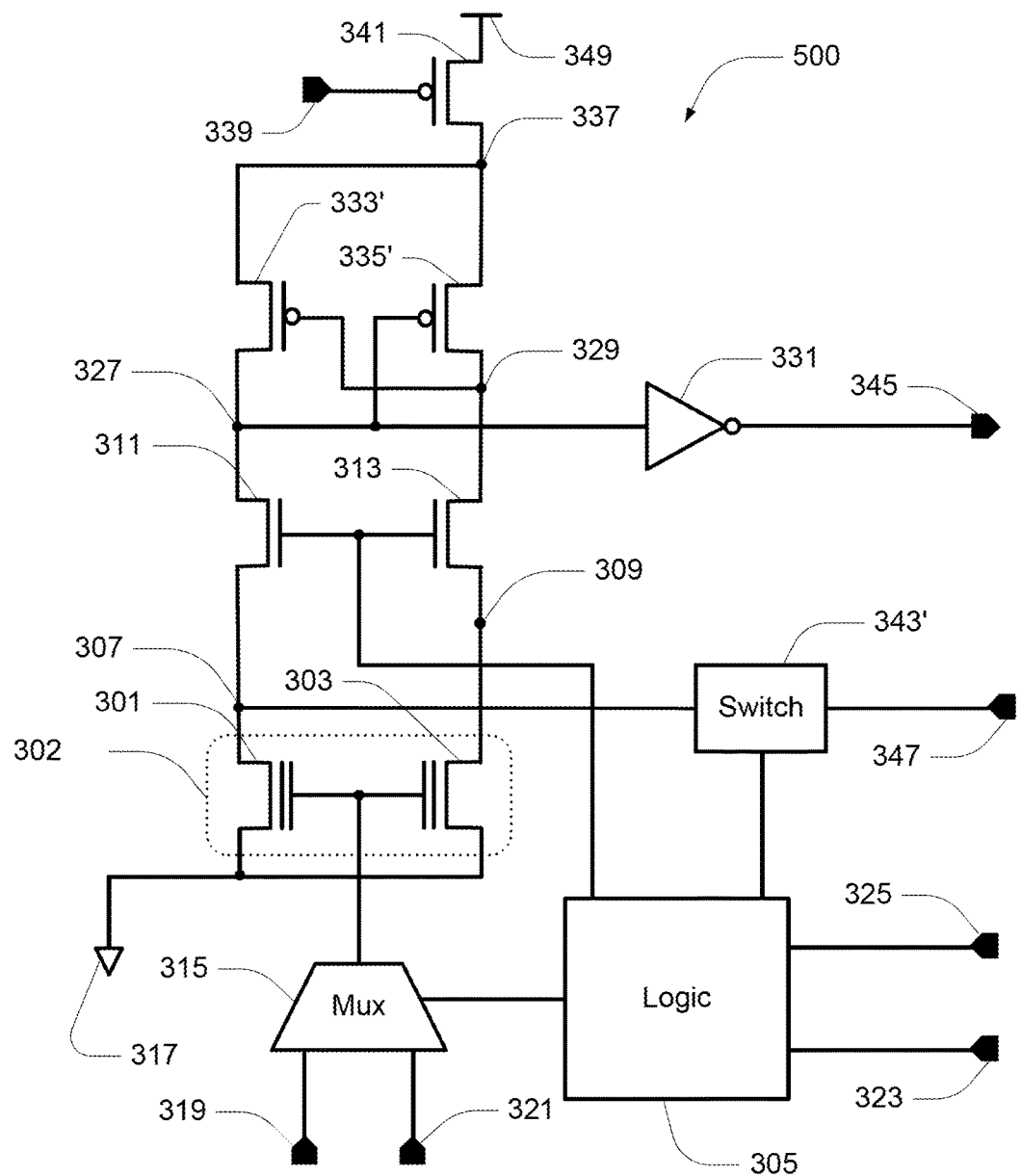
FIG. 5 is a schematic of a differential storage device 400 in accordance with a further embodiment.

Various embodiments may be configured to initiate programming of one of the non-volatile memory cells 301 or 303 only when the data value of the prior page data has a particular logic level. FIG. 5 is a schematic of a differential storage device 500 in accordance with a further embodiment. The differential storage device 500 may differ from the differential storage device 300 in the replacement of the multiplexer 343 with a switch 343' such that only one of the nodes 307 and 309 is selectively connected to the voltage signal node 347. In addition, the pFETs 333' and 335' may have differing W/L ratios or otherwise configured to have different conductance at a particular gate voltage. For the example of FIG. 5, the W/L ratio of the pFET 335' may be greater than the W/L ratio of the pFET 333', such that its conductance at a particular gate voltage is less than the conductance of the pFET 333'. In this manner, a default logic level of the node 327 may be a logic low level if both non-volatile memory cells 301 and 303 are unprogrammed, and a logic high level if the non-volatile memory cell 301 is programmed. Programming and erasing of the non-volatile memory cell 301 in this example can be performed as discussed with reference to FIGS. 3A, 3B and 4, with any apparent modifications in structure as discussed with reference to FIG. 3B or 4.

Figure 6A:
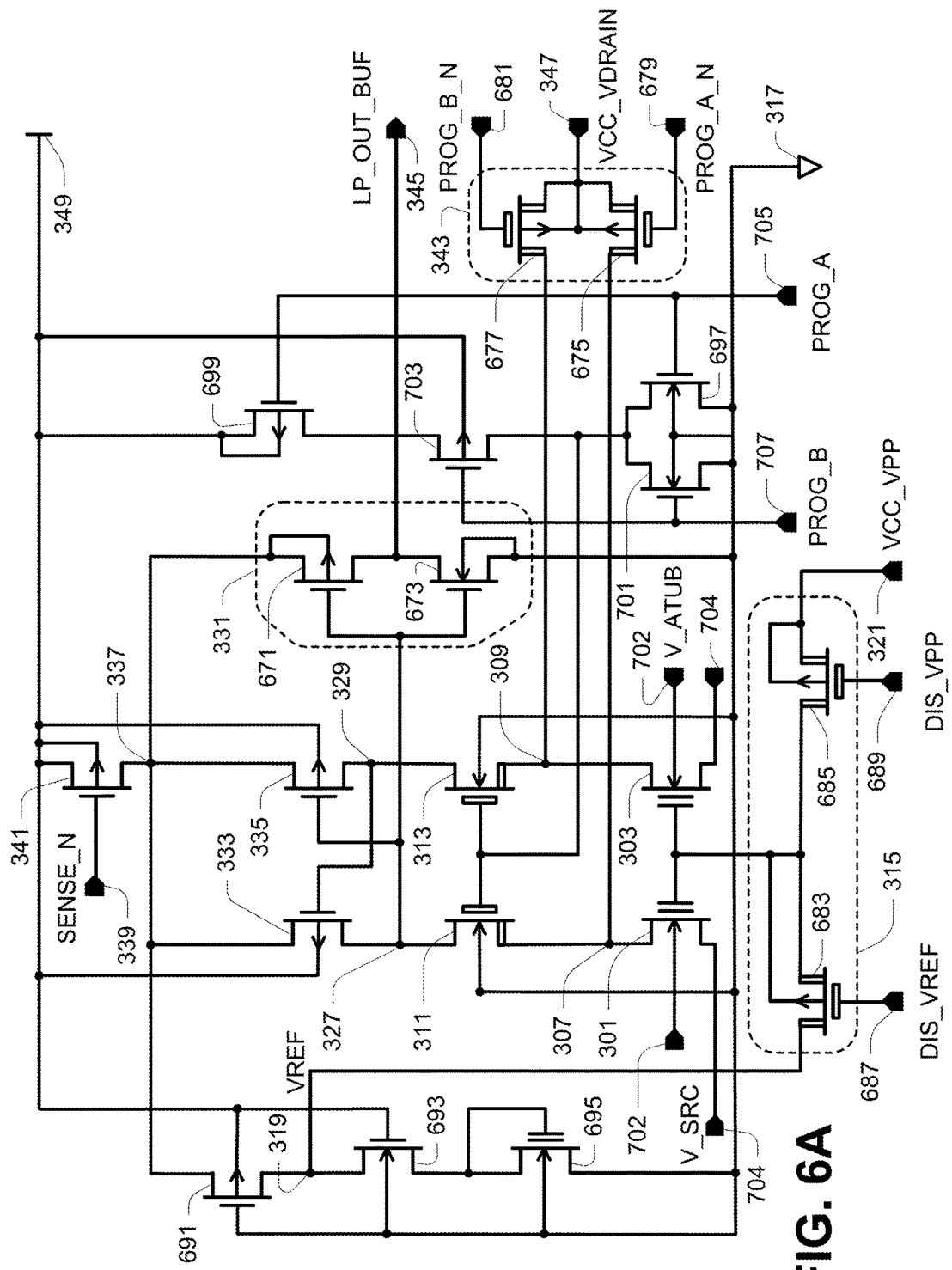
FIGS. 6A-6E collectively depict a schematic of a specific implementation of a differential storage device of the type described with reference to FIG. 3A.

FIGS. 6A-6E collectively depict a schematic of a specific implementation of a differential storage device of the type described with reference to FIG. 3A. As depicted in FIG. 6A, the nFETs 311 and 313 may be high-voltage nFETs sufficient to protect the pFETs 333 and 335 from the voltages utilized during programming and/or erasing of the non-volatile memory cells 301 and 303. The inverter 331 may include a pFET 671 and an nFET 673 connected in series between the node 337 and the voltage node 317. As an alternative to connecting the non-volatile memory cells 301 and 303 to the voltage node 317, such as in FIG. 3A, the non-volatile memory cell 301 might have a first source/drain connected to the voltage node 704 and a second source/drain connected to the node 307, while the non-volatile memory cell 303 might have a first source/drain connected to the voltage node 704 and a second source/drain connected to the node 309. The voltage node 704 might be configured to receive the voltage V_SRC, which may be a same voltage as received by the voltage node 317. Separation of the voltage nodes 317 and 704 might be used to improve noise immunity to the non-volatile memory cells 301 and 303, for example. The bodies of the non-volatile memory cells 301 and 303 may be connected to the voltage node 702, which might represent the isolated well structure 302 of FIG. 3A, configured to receive the voltage V_ATUB. The voltage V_ATUB may be a same voltage as received by the voltage node 317 during programming or reading the differential storage device, and may be an erase voltage, e.g., 20V, during an erase operation on the non-volatile memory cells 301 and 303.

The multiplexer 315 may include pFETs (e.g., high-voltage pFETs) 683 and 685 connected in series between the voltage nodes 319 and 321. The gate of the pFET 683 may be connected to the control signal node 687 to receive a control signal DIS_VREF from the logic 305 of FIG. 3A, and the gate of the pFET 685 may be connected to the control signal node 689 to receive a control signal DIS_VPP from the logic 305 of FIG. 3A. The voltage node 319 may be the output of a voltage divider including nFETs 691, 693 and 695 connected in series between the voltage node 349 (e.g., selectively connected through pFET 341) and the voltage node 317. The nFET 695 may be a non-volatile memory cell 695 to permit adjustment of the voltage level of the voltage node 319. For example, the voltage level of the voltage node 319 may be adjusted to a level sufficient to activate an unprogrammed non-volatile memory cell 301 or 303, and insufficient to activate a programmed non-volatile memory cell 301 or 303.

The multiplexer 343 may include pFETs (e.g., high-voltage pFETs) 675 and 677, each connected in series between the voltage signal node 347 and their respective node 307 or 309. The gate of the pFET 675 may be connected to the control signal node 679 to receive a control signal PROG_A_N from the logic 305 of FIG. 3A, and the gate of the pFET 677 may be connected to the control signal node 681 to receive a control signal PROG_B_N from the logic 305 of FIG. 3A. Depending upon the desired voltages, the pFETs 675 and 677 of the multiplexer 343 might instead be nFETs, e.g., high-voltage nFETs.

As depicted in FIG. 6A, the differential storage device of FIGS. 6A-6E may further include nFETs 697 and 701, and pFETs 699 and 703. The nFETs 697 and 701 are each connected in series with the pFETs 699 and 703 between the voltage node 349 and the voltage node 317, and are connected in parallel with each other. The control gates of the nFET 697 and the pFET 699 are each connected to the control signal node 705 to receive a control signal PROG_A, and the control gates of the nFET 701 and the pFET 703 are each connected to the control signal node 707 to receive a control signal PROG_B. The nFETs 697 and 701, and the pFETs 699 and 703, may form a portion of the logic 305 of FIG. 3A.

Figure 6B:
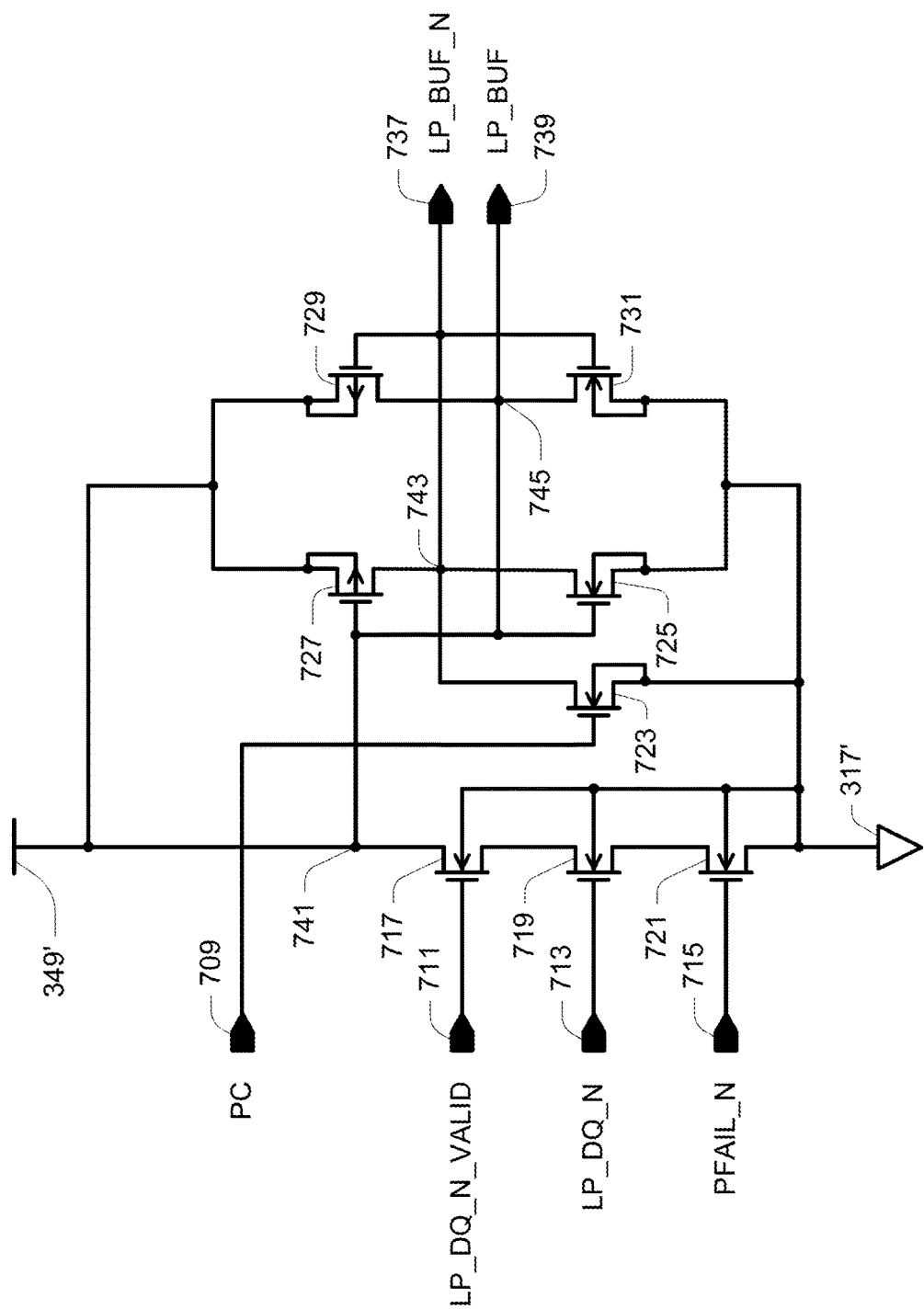

For some embodiments, it may be desirable to decouple the data value of the prior page data from its source, e.g., a sensing device, cache register or other temporary storage. FIG. 6B depicts a portion of the differential storage device that may provide such decoupling. As depicted in FIG. 6B, the differential storage device may further include nFETs 717, 719 and 721 connected in series between a voltage node 349' and a voltage node 317'. The voltage node 349' may be the same as the voltage node 349 of FIG. 6A or otherwise configured to receive the same voltage level. The voltage node 317' may be the same as the voltage node 317 of FIG. 6A or otherwise configured to receive the same voltage level. The gate of the nFET 717 is connected to the control signal node 711 to receive a control signal LP_DQ_N_VALID, the gate of the nFET 719 is connected to the control signal node 713 to receive a control signal LP_DQ_N, and the gate of the nFET 721 is connected to the control signal node 715 to receive a control signal PFAIL_N. The control signal LP_DQ_N_VALID may have a logic high level when the data value of the prior page data to be stored by the differential storage device is valid, the control signal LP_DQ_N may represent the complement of the data value of the prior page data, the control signal PFAIL_N may have a logic high level to indicate a normal power level. Each of these control signals might be received from the control logic 116 of FIG. 1A, for example.

The nFETs 725 and 731, and the pFETs 727 and 729, may form a latch configured as a pair of cross-coupled inverters between the voltage node 349' and the voltage node 317', having an input (e.g., the gates of the nFET 725 and the pFET 727) connected to node 741. The input of the latch is further connected to node 745 between the nFET 731 and the pFET 729. The node 743 between the nFET 725 and the pFET 727 is connected to the gates of the nFET 731 and the pFET 729, as well as the output node 737, providing a control signal LP_BUF_N that may be representative of the complement of the data value of the prior page data. The node 745 is connected to the output node 739, providing a control signal LP_BUF that may be representative of the data value of the prior page data. An nFET 723 might be connected between the node 743 and the voltage node 317' for selectively precharging the latch, e.g., setting the output node 737 to a logic low level and the output node 739 to a logic high level. The nFET 723 may have its gate connected to the control signal node to receive a control signal PC, indicative of whether such a precharge is desired, and may be received from the control logic 116 of FIG. 1A.

Figure 6C:
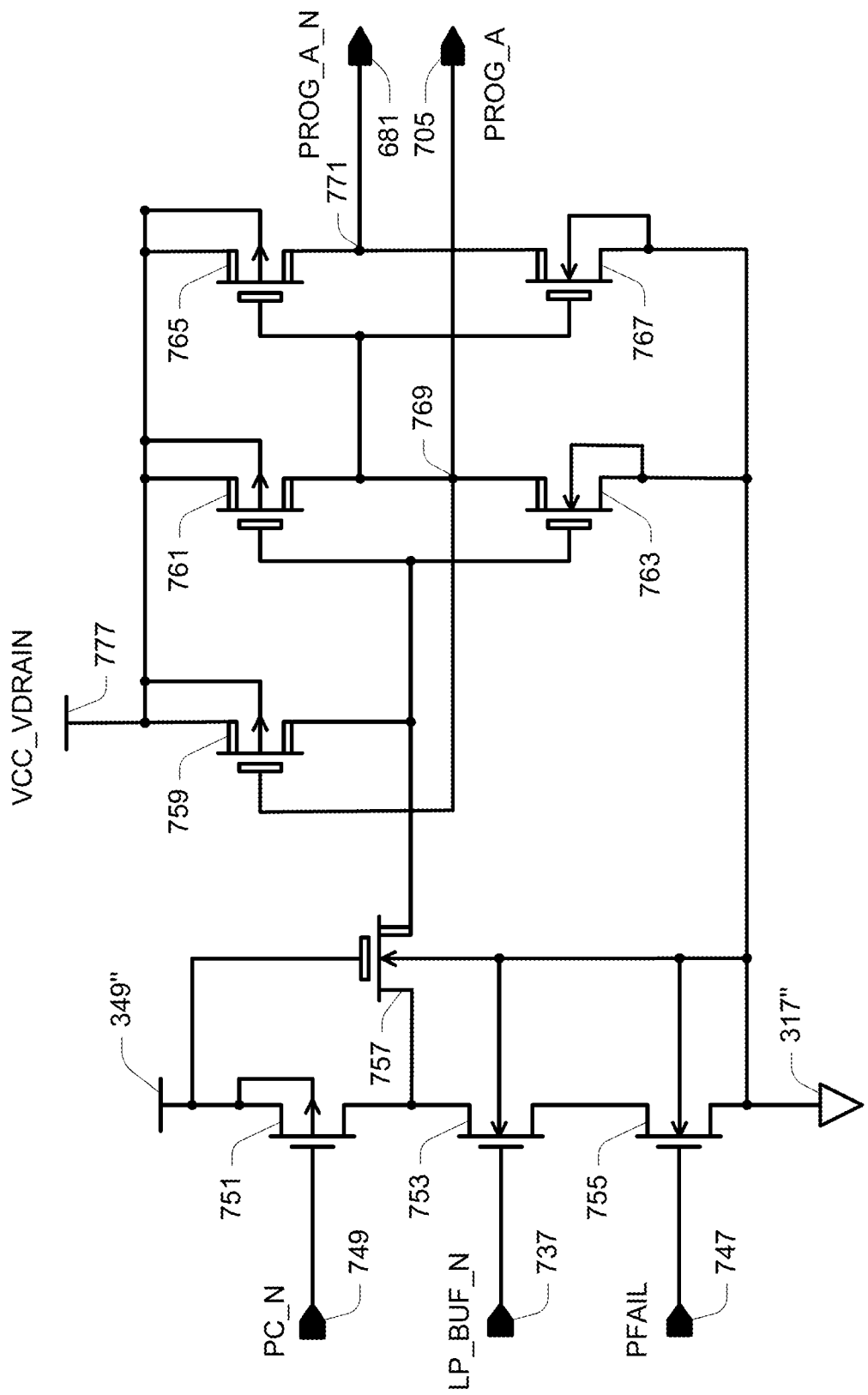

FIG. 6C depicts a level shifter of the differential storage device that may be a portion of the logic 305 of FIG. 3A, and may be configured to generate an output control signal having a voltage level of the voltage node 777, e.g., configured to receive a voltage VCC_VDRAIN. VCC_VDRAIN may be selected to have a voltage level sufficient to program a non-volatile memory cell 301 or 303 when applied to its drain as previously described. The level shifter of FIG. 6C may be a portion of the logic 305 of FIG. 3A.

As depicted in FIG. 6C, pFET 751, nFET 753 and nFET 755 are connected in series between the voltage node 349" and a voltage node 317". The voltage node 349" may be the same as the voltage node 349 of FIG. 6A or otherwise configured to receive the same voltage level. The voltage node 317" may be the same as the voltage node 317 of FIG. 6A or otherwise configured to receive the same voltage level. The gate of the pFET 751 is connected to the control signal node 749 to receive a control signal PC_N, the gate of the nFET 753 is connected to the control signal node 737 to receive the control signal LP_BUF_N, and the gate of the nFET 755 is connected to the control signal node 747 to receive a control signal PFAIL. The control signal PC_N may be the complement of the control signal PC, and the control signal PFAIL may be the complement of the control signal PFAIL_N, e.g., having a logic high level to indicate a power loss, and each of these control signals might be received from the control logic 116 of FIG. 1A, for example.

The control signals PFAIL and PFAIL_N, for example, might be output signals of a voltage level detection circuit of the control logic 116 that are often used to detect when a supply voltage, such as Vcc, falls below some minimum threshold value. As one example, a supply voltage Vcc may have a specification calling for a nominal value of 3.3V, with a desired (e.g., acceptable) range of 2.7V-3.6V. A voltage detection circuit might be configured to generate the control signal PFAIL having a logic high level if the voltage level of Vcc falls below some threshold value (e.g., some minimum threshold value), such as 2.5V for this example. Such voltage detection circuits are well known in the art, and will not be described herein as they are not the subject of the present disclosure. Adjustments to the threshold value might be warranted to permit operation of a differential storage device in accordance with an embodiment without connection to an auxiliary energy storage device. To continue the foregoing example, if a threshold value of 2.5V would not provide sufficient time to program the non-volatile memory cells of the differential storage device before the supply voltage fell to unusable levels, the threshold value might be increased, and may be increased to some level within the desired range of threshold voltages, e.g., within the range of 2.7V-3.6V in this example. While this might result in unnecessary programming of the differential storage device in response to a dip in power, the non-volatile memory cells of the differential storage device could be erased if the supply voltage returned to its nominal value.

The level shifter of FIG. 6C may further include an nFET (e.g., high-voltage nFET) 757 having a first source/drain connected to a source/drain between the pFET 751 and the nFET 753. The level shifter of FIG. 6C may further include an nFET (e.g., high-voltage nFET) 763 and a pFET (e.g., high-voltage pFET) 761 connected in series between the voltage node 777 and the voltage node 317". The nFET 763 and pFET 761 have their gates connected to a second source/drain of the nFET 757, and to a source/drain of the pFET (e.g., high-voltage pFET) 759 having a second source/drain connected to the voltage node 777.

The level shifter of FIG. 6C may further include an nFET (e.g., high-voltage nFET) 767 and a pFET (e.g., high-voltage pFET) 765 connected in series between the voltage node 777 and the voltage node 317". The nFET 763 and pFET 761 have their gates connected to the node 769 and to the gate of the pFET 759. The node 769 is connected to the control signal node 705 to provide the control signal PROG_A, and the node 771 is connected to the control signal node 681 to provide the control signal PROG_A_N, e.g., the complement of the control signal PROG_A.

Figure 6D:
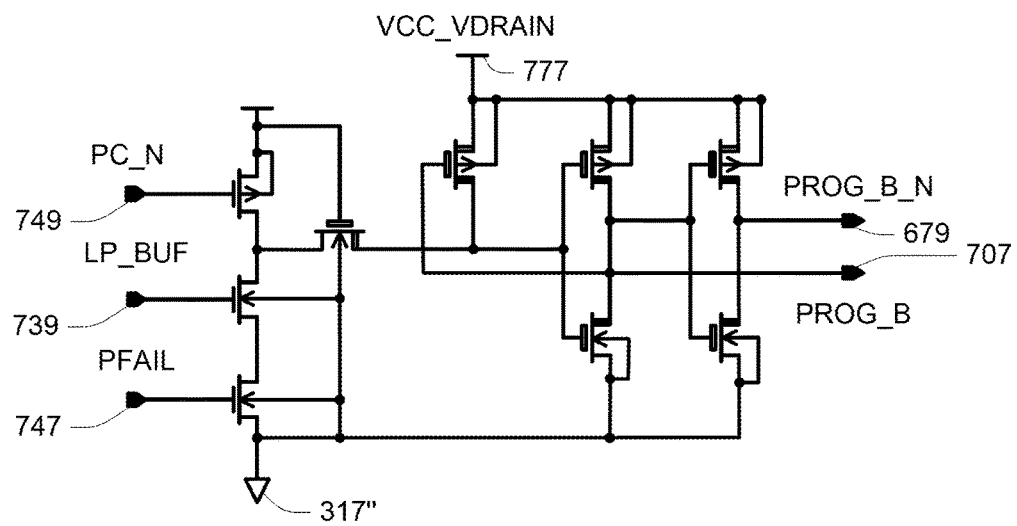

FIG. 6D depicts another level shifter of the differential storage device that may be a portion of the logic 305 of FIG. 3A, and may be configured to generate an output control signal having the voltage level VCC_VDRAIN. The structure of FIG. 6D is depicted to be the same as the structure of FIG. 6C, and will thus only with respect to the differences between the inputs and outputs. Instead of receiving the control signal LP_BUF_N (e.g., representative of the complement of the data value of the prior page data) from control signal node 737, the level shifter of FIG. 6D is configured to receive the control signal LP_BUF from control signal node 739. In addition, instead of providing the control signals PROG_A and PROG_A_N at control signal nodes 705 and 681, respectively, the level shifter of FIG. 6D provides the control signals PROG_B and PROG_B_N at control signal nodes 707 and 679, respectively. The control signal PROG_B is generally the complement of the control signal PROG_A, and the control signal PROG_B_N is generally the complement of the control signal PROG_B. The level shifter of FIG. 6D may be a portion of the logic 305 of FIG. 3A.

Figure 6E:
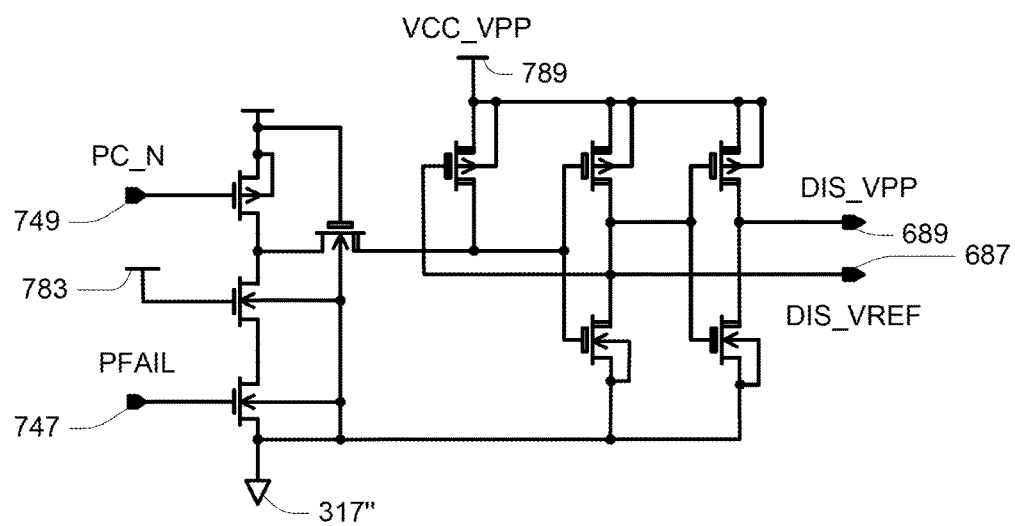

FIG. 6E depicts another level shifter of the differential storage device that may be a portion of the logic 305 of FIG. 3A, and may be configured to generate an output control signal having the voltage level VCC_VPP. The structure of FIG. 6E is depicted to be the same as the structure of FIG. 6C, and will thus only with respect to the differences between the inputs and outputs. Instead of receiving the control signal LP_BUF_N (e.g., representative of the complement of the data value of the prior page data) from control signal node 737, the level shifter of FIG. 6D is configured to receive the voltage level of the voltage node 783 (e.g., at the gate of the nFET 753). The voltage node 783 may be configured to receive the same voltage level as the voltage node 349 of FIG. 6A. In addition, instead of providing the control signals PROG_A and PROG_A_N at control signal nodes 705 and 681, respectively, the level shifter of FIG. 6E provides the control signals DIS_VREF and DIS_VPP at control signal nodes 687 and 689, respectively. The control signal DIS_VPP is generally the complement of the control signal DIS_VREF. The level shifter of FIG. 6E may be a portion of the logic 305 of FIG. 3A.

Table 1 may illustrate representative values of the various control signals of FIGS. 6A-6E during normal operation and when a power loss is detected. In Table 1, "0" represents a logic low level, "1" represents a logic high level, and "X" represents "do not care" values of the logic levels.

TABLE 1

|  | Normal Operation | Power Loss Detected | Read Operation |
| --- | --- | --- | --- |
| PC | 0 | X | X |
| PC_N | 1 | X | X |
| LP_DQ_N_VALID | 1 | X | X |
| LP_DQ_N | 0/1 | 0/1 | X |
| PFAIL | 0 | 1 | 0 |
| PFAIL_N | 1 | 0 | X |
| LP_BUF | 1/0 | 1/0 | X |
| LP_BUF_N | 0/1 | 0/1 | X |
| PROG_A | 0 | 0/1 | 0 |

TABLE 1-continued

|  | Normal Operation | Power Loss Detected | Read Operation |
| --- | --- | --- | --- |
| PROG_A_N | 1 | 1/0 | 1 |
| PROG_B | 0 | 1/0 | 0 |
| PROG_B_N | 1 | 0/1 | 1 |
| DIS_VREF | 0 | 1 | 0 |
| DIS_VPP | 1 | 0 | 1 |
| SENSE_N | 1 | 1 | 0 |

With reference to FIGS. 6A-6E, in response to the control signal PFAIL transitioning from a logic low level to a logic high level, the level shifters of FIGS. 6C-6E will generate (e.g., automatically generate) values of the control signals PROG_A, PROG_A_N, PROG_B, PROG_B_N, DIS_VREF and DIS_VPP representative of the values of the control signals LP_BUF and LP_BUF_N indicative of the data value of the prior page data to be stored. As a result, the nFETs 311 and 313 will be deactivated in response to connecting their gates to the voltage node 317, the voltage VCC_VDRAIN will be applied to a select one of the nodes 307 or 309, and the voltage VCC_VPP will be applied to the gates of the non-volatile memory cells 301 and 303. The non-volatile memory cell 301 or 303 receiving the voltage VCC_VDRAIN at its second source/drain while its first source/drain is connected to the voltage node 317 and its gate is connected to receive the voltage VCC_VPP will be expected to accumulate charge on its data-storage structure, thus increasing its threshold voltage.

Figure 7:
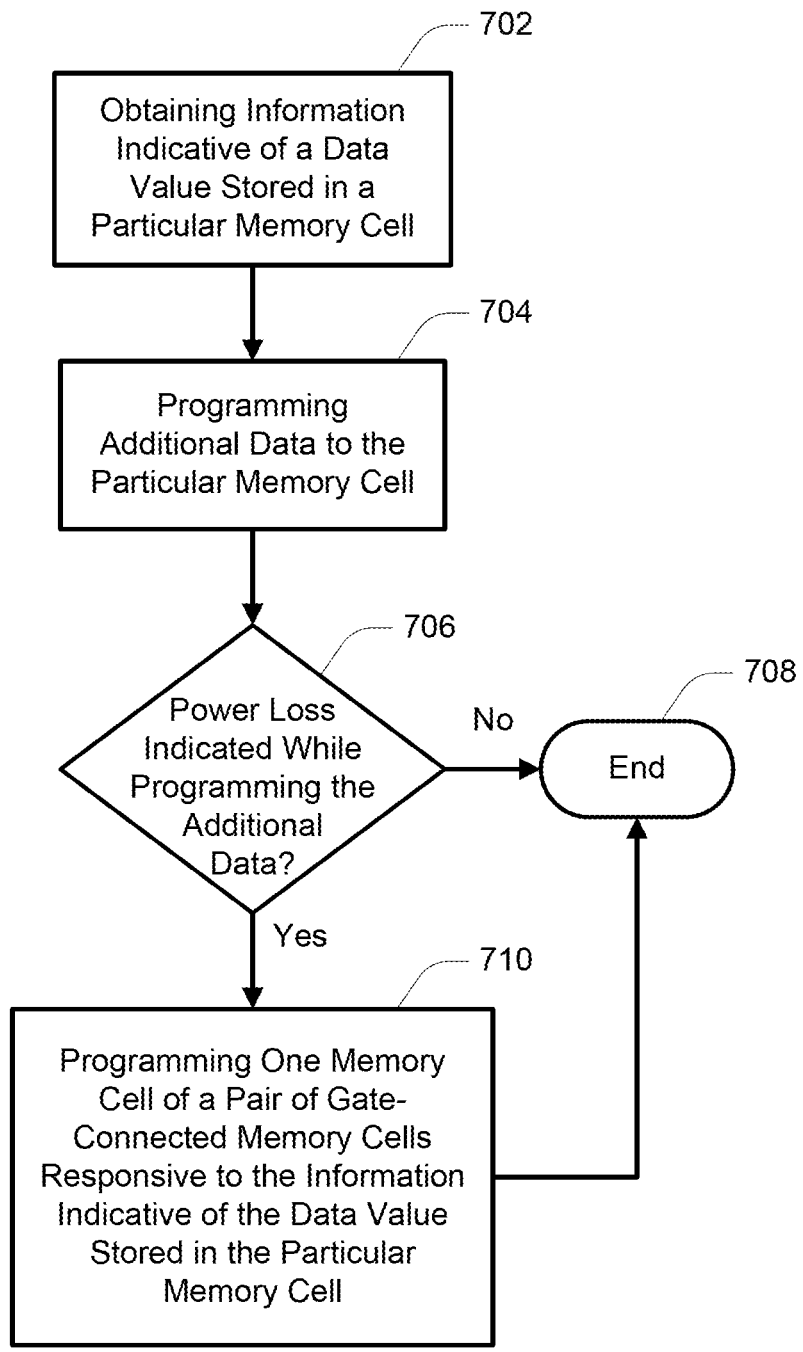
FIG. 7 is a flowchart of a method of operating a memory containing a differential storage device in accordance with an embodiment.

FIG. 7 is a flowchart of a method of operating a memory containing a differential storage device in accordance with an embodiment. At 702, information indicative of a data value stored in a particular memory cell is obtained. For example, the information may be indicative of a data value of a prior (e.g., lower) page of data stored in a memory cell that is intended to undergo a programming operation to further store a subsequent (e.g., upper) page of data to that memory cell. The information indicative of the data value may be obtained directly from a data source, such as a cache register of a memory device, or it may be decoupled from the data source and stored in a latch, for example. The information indicative of the data value may be represented by one or more control signals.

Using the example of a memory cell configured for programming as a four-level MLC memory cell, a first digit (e.g., bit) of data may be programmed to the memory cell prior to programming its second digit (e.g., bit) of data. As is typical, there may be several intervening programming operations on other memory cells, such as other memory cells in a same string of series-connected memory cells containing the particular memory cell, between programming of the first digit of data (e.g., the prior page of data) and the second digit of data (e.g., the subsequent page of data). The information indicative of the data value stored in the particular memory cell may be obtained by reading the first digit of data from the particular memory cell prior to performing the programming operation to store the second digit of data. Alternatively, the information indicative of the data value stored in the particular memory cell may still be available from the prior programming operation.

At 704, additional data is programmed to the particular memory cell. For example, the subsequent page (e.g., second digit) of data may be programmed to the memory cell. At 706 it is determined if a power loss is indicated while programming the additional data. Power loss may be indicated, for example, by a control signal transitioning from one logic level to a different logic level. If no power loss is indicated at 706, the programming of the additional data may proceed under normal operation. If a power loss is indicated at 706, the process may proceed to 710.

At 710, one memory cell of a pair of gate-connected non-volatile memory cells of a differential storage device in accordance with an embodiment may be programmed responsive to the information indicative of the data value stored in the particular memory cell. There may be a respective differential storage device for each memory cell of a logical page of memory cells being programmed during a single programming operation. As such, the prior page data of each memory cell of that logical page of memory cells may be stored to the pair of gate-connected non-volatile memory cells of their respective differential storage device in the event of a power loss. As noted for some embodiments, storing the prior page data of a memory cell to a pair of gate-connected non-volatile memory cells does not necessarily require programming of a memory cell of that pair of gate-connected non-volatile memory cells, e.g., where one data value is indicated by the programming of one of the memory cells, and the other data value is indicated by the lack of programming either of the memory cells.

As noted previously, programming times might be shortened compared to programming of a typical array of memory cells, such that it may be possible to obtain sufficient programming of the gate-connected non-volatile memory cells of a differential storage device without the need for an added hold-up capacitance or other auxiliary energy storage device as is typically used to recover from a power loss event. Accordingly, for some embodiments, the voltage nodes of the differential storage device may be devoid of connection to an auxiliary energy storage device.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. An apparatus, comprising:
an array of memory cells; and
a differential storage device configured to receive information indicative of a data value stored in a particular memory cell of the array of memory cells selected for a programming operation, the differential storage device comprising:
a first non-volatile memory cell connected between a first isolation gate and a voltage node configured to receive a first voltage level;
a second non-volatile memory cell connected between a second isolation gate and the voltage node, wherein a gate of the second non-volatile memory cell is connected to a gate of the first non-volatile memory cell; and
logic responsive to an indication of a loss of power to the apparatus and the information indicative of the data value stored in the particular memory cell;
wherein the logic is configured to cause the first isolation gate and the second isolation gate to be deactivated in response to the indication of a loss of power to the memory having a particular logic level regardless of a logic level of the information indicative of the data value stored in the particular memory cell;
wherein the logic is further configured to cause a second voltage level higher than the first voltage level to be applied to gates of the first non-volatile memory cell and the second non-volatile memory cell in response to the indication of a loss of power to the memory having its particular logic level regardless of the logic level of the information indicative of the data value stored in the particular memory cell;
wherein the logic is further configured to cause a third voltage level, less than the second voltage level and greater than the first voltage level, to be applied to a node between the first non-volatile memory cell and the first isolation gate in response to the indication of a loss of power to the memory having its particular logic level and the information indicative of the data value stored in the particular memory cell having a particular logic level; and
wherein the logic is further configured to cause the first voltage level to be applied to the node between the first non-volatile memory cell and the first isolation gate in response to the indication of a loss of power to the memory having its particular logic level and the information indicative of the data value stored in the particular memory cell having a logic level different than its particular logic level.

2. The apparatus of claim 1, further comprising:
a respective differential storage device for each remaining memory cell of the array of memory cells selected for the programming operation.

3. The apparatus of claim 2, wherein the particular memory cell and for each remaining memory cell of the array of memory cells selected for the programming operation collectively comprise a logical page of memory cells of the array of memory cells.

4. The apparatus of claim 2, wherein each respective differential storage device comprises:
a first non-volatile memory cell connected between a first isolation gate and the voltage node;
a second non-volatile memory cell connected between a second isolation gate and the voltage node, wherein a gate of the second non-volatile memory cell is connected to a gate of the first non-volatile memory cell; and
logic responsive to the indication of a loss of power to the memory and information indicative of a data value stored in its respective memory cell;
wherein the logic is configured to cause the first isolation gate and the second isolation gate to be deactivated in response to the indication of a loss of power to the memory having its particular logic level regardless of a logic level of the information indicative of the data value stored in its respective memory cell;
wherein the logic is further configured to cause the second voltage level to be applied to gates of the first non-volatile memory cell and the second non-volatile memory cell in response to the indication of a loss of power to the memory having its particular logic level regardless of the logic level of the information indicative of the data value stored in its respective memory cell;

wherein the logic is further configured to cause the third voltage level to be applied to a node between the first non-volatile memory cell and the first isolation gate in response to the indication of a loss of power to the memory having its particular logic level and the information indicative of the data value stored in its respective memory cell having a particular logic level; and wherein the logic is further configured to cause the first voltage level to be applied to the node between the first non-volatile memory cell and the first isolation gate in response to the indication of a loss of power to the memory having its particular logic level and the information indicative of the data value stored in its respective memory cell having a logic level different than its particular logic level.

5. The apparatus of claim 1, wherein the indication of a loss of power to the apparatus comprises an indication of a loss of power to a portion of the apparatus containing the array of memory cells.

6. The apparatus of claim 1, wherein the logic is further configured to:

cause the third voltage level to be applied to a node between the second non-volatile memory cell and the second isolation gate in response to the indication of a loss of power to the memory having its particular logic level and the information indicative of the data value stored in the particular memory cell having the logic level different than its particular logic level; and cause the first voltage level to be applied to the node between the second non-volatile memory cell and the second isolation gate in response to the indication of a loss of power to the memory having its particular logic level and the information indicative of the data value stored in the particular memory cell having its particular logic level.

7. The apparatus of claim 1, wherein the apparatus is a vehicle.

8. The apparatus of claim 1, wherein the logic being responsive to the indication of a loss of power to the apparatus comprises the logic being responsive to complementary control signals indicative of a voltage level of a supply voltage relative to a threshold, and the logic being responsive to the information indicative of the data value stored in the particular memory cell comprises the logic being responsive to complementary control signals indicative of a logic level of the data value stored in the particular memory cell.

9. The apparatus of claim 1, wherein the logic is further responsive to one or more additional control signals.

* * * * *